United States Patent [19]

Rieger et al.

[11] Patent Number: 5,274,338

[45] Date of Patent: Dec. 28, 1993

[54] INTEGRATED FM DETECTOR INCLUDING AN OSCILLATOR HAVING A CAPACITOR AND SCHMITT TRIGGER

[75] Inventors: Martin Rieger, Rottweil-Neukirch; Sabine Roth, VS-Villingen, both of Fed. Rep. of Germany

[73] Assignee: Deutsche Thomson-Brandt GmbH, Villingen-Schwenningen, Fed. Rep. of Germany

[21] Appl. No.: 33,073

[22] Filed: Mar. 10, 1993

Related U.S. Application Data

[63] Continuation of Ser. No. 942,913, Sep. 10, 1992, filed as PCT/EP91/00162, Jan. 29, 1991, abandoned.

[30] Foreign Application Priority Data

Feb. 5, 1990 [DE] Fed. Rep. of Germany ....... 4003418

[51] Int. Cl.$^5$ ............................................. H03D 3/00
[52] U.S. Cl. .................................. 324/324; 375/82; 455/214; 331/111
[58] Field of Search ............... 329/323, 324; 375/82; 455/214, 337; 331/111

[56] References Cited

U.S. PATENT DOCUMENTS 3,694,772  9/1972  Sordello ........................... 331/111
3,869,679  3/1975  Grebene ............................ 331/8
4,928,068  5/1990  Main ................................. 329/324

FOREIGN PATENT DOCUMENTS 0395860  11/1990  European Pat. Off. .

OTHER PUBLICATIONS

IEEE Transactions On Consumer Electronics Aug. 1988 vol. 34 No. 3 pp. 625 to 633, Yamamoto et al, "A New Audio Processor For EIAJ MTS".

Primary Examiner—Siegfried H. Grimm
Attorney, Agent, or Firm—Joseph S. Tripoli; Peter M. Emanuel; Richard G. Coalter

[57] ABSTRACT

An FM detector for demodulating frequency modulated signals includes an FM detector having an oscillator composed of a capacitor and a Schmitt Trigger. The oscillator is controlled by the input signal to the FM detector. The FM detector also includes a phase detector for mixing the input signal with an oscillator signal from the oscillator to provide an output signal. The frequency of the oscillator is set to the frequency of the input signal using components internal to the FM detector. A first switch is used to charge and discharge the capacitor in accordance with the state of the Schmitt Trigger. A second switch is used to set the frequency of the oscillator to the frequency of the input signal.

2 Claims, 4 Drawing Sheets $$T_{period} = \frac{2 \cdot C_{osc} \cdot (V_{pp} - 2V_\Delta)}{I_{osc}}$$

$$V_\Delta = 4.5 \cdot V_T$$

$$\Delta\varphi = \frac{\pi}{2}\left(1 + \frac{\Delta f}{K \cdot f_{nom}}\right)$$

$$\Delta f = f_{INPUT} - f_{nom}$$

$$K = \frac{\Delta f_{max}}{f_{nom}}$$

INTEGRATED FM DETECTOR INCLUDING AN OSCILLATOR HAVING A CAPACITOR AND SCHMITT TRIGGER

This is a continuation of application Ser. No. 07/942,913, filed Sep. 10, 1992, filed as PCT/EP91/00162, Jan. 29, 1991, and now abandoned.

This is a continuation of PCT application PCT/EP 91/00162 filed Jan. 19, 1991 by Martin Rieger and Sabine Roth and titled "Integrated FM Detector".

This invention is directed to an FM detector for demodulating signals, in particular sound signals. An FM detector of similar type is described in IEEE Transactions on Consumer Electronics, Vol. 34, No. 3, August 1988, IEEE; New York, U.S.; Y. Yamamoto et al.: "A New Audio Processor For EIAJ MTS", pages 625 through 633 or U.S. Pat. No. 3,694,722. Such FM detectors are preferably made use of in those situations where frequency modulated signals must be converted into low frequency sound signals. This is especially the case in television or radio receivers.

As with most of the other circuit sections in a television or radio receiver, an effort is made to arrange the FM detectors so that they take up a minimum of space. Prior art FM detectors are integrated to some extent but typically must be provided with external components, for example, ceramic filters or LC circuits, in order to obtain good signal-to-noise ratio and to avoid thermal drift of the charge carriers. Additionally, time-consuming and expensive adjusting and tuning of the FM detectors and the external components is frequently necessary.

It is an object of the invention to provide an integrated FM detector in which the expenditure on external components for setting the internal operating conditions, and also the expenditure for manual adjustment of the external components are reduced.

The invention solves this task in that internal regulating and control circuits arranged within the FM detector and the need for external components is substantially reduced.

A preferred embodiment is described with reference to the drawings in which.

Figure 1:
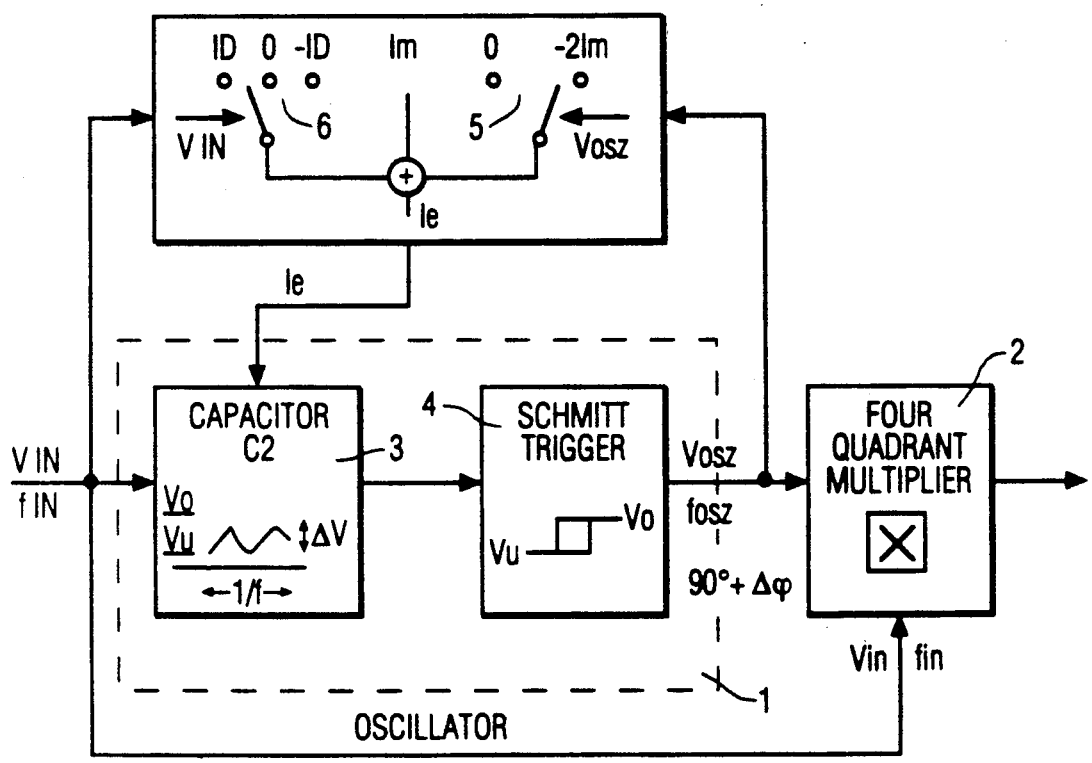
FIG. 1 is a simplified circuit diagram of a preferred embodiment of an FM detector.

FIG. 1 shows, in principle, a circuit layout for an FM demodulator. The circuit consists of a phase-regulation circuit which includes a current-controlled oscillator 1 and a four-quadrant/analog multiplier 2 acting as phase detector. The oscillator 1 consists of a current-controlled charging capacitor 3 and a Schmitt trigger 4. The freerunning frequency of the oscillator is $f_0 = (2\Delta V C2/Im)$, $\Delta V$ is the voltage difference between the voltages Vu and Vo of the charging capacitor, C2 is the capacitance of the charging capacitor 3. Voltages Vo and Vu, respectively, are the high and low switching potentials of the Schmitt trigger 4. The operation of a Schmitt trigger is well known in the art. In the steady state, the charging capacitor 3 is charged through the average direct current Im. Depending on the state of the Schmitt trigger and, therewith, the oscillator voltage Vosz, the switch 5 is alternately set to 0 or to $-2$Im and the respective current ($-2$Im or 0) is superimposed with current Im. The resulting current Ie=(Im or $-$Im) charges or discharges the charging capacitor 3. After the oscillator frequency settles (i.e. in the steady state) to the input frequency, the switch 6 is set to zero. In other cases the switch 6 is switched to either Id or $-$Id in order to set the oscillator to the input frequency. In setting the oscillator frequency, the current Id or $-$Id serves as direct current compensation current and is also superimposed with Im or $-$Im. Thus, the charging capacitor, and hence the oscillator, can settle to the input frequency fin of the input signal within the range $f_0 - \Delta f$ through $f_0 + \Delta f$: where, $\Delta f/f_0 = $Id$/$Im serves as output equation. For an unmodulated input frequency fin=$f_0$, a phase shift of 90 degrees occurs at the output terminal of the Schmitt trigger, i.e. at the output terminal of the oscillator 1. With a frequency-modulated input signal an additional phase shift of $\Delta\gamma$ proportional to fin-$f_0$ results. The oscillator 1 output voltage $V_{osz}$, having the oscillator frequency fosz, is mixed with the input voltage Vin, having the input frequency fin, by the phase detector 2 to provide a pulse width modulated signal at the output terminal of the phase detector. This pulse width modulated signal can, for example, be converted into a low frequency sound signal by means of a low pass filter (not shown).

Figure 2:
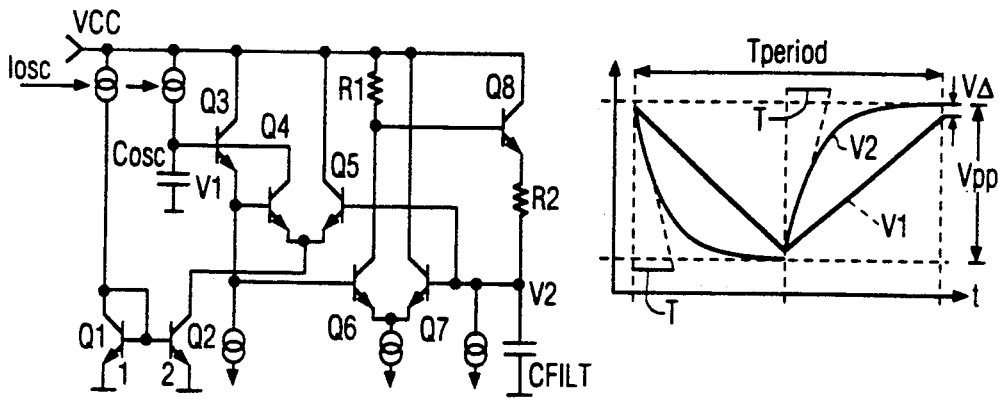
FIG. 2 is a schematic circuit diagram of an oscillator with associated time-dependency diagrams.

FIG. 2 is a schematic circuit diagram of the oscillator together with the associated time-dependency diagram. The transistors Q6 through Q8 form a Schmitt trigger which controls a differential amplifier designed as a switch. Thereby, a D voltage is generated as shown in the time-dependency diagram in FIG. 2. Particular attention should be paid to the signal-to-noise ratio with this oscillator. In order to obtain a good signal-to-noise ratio it is necessary to limit the band width of the Schmitt trigger. A filter capacitance CFilt is provided for this purpose. The time constant is as large as possible but small enough to avoid a frequency deviation which is too large (T=0, 13×TPeriode). Without this filtering the signal-to-noise ratio of the FM detector is inadequate.

Figure 3:
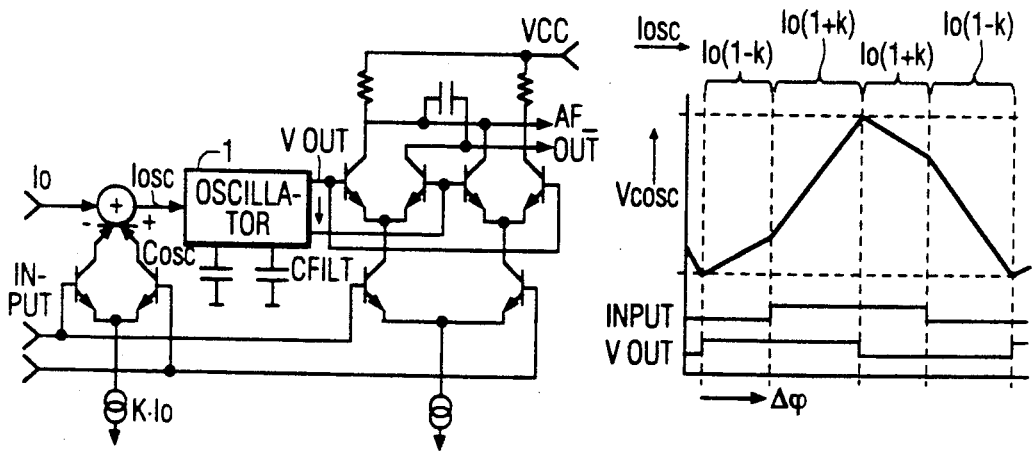
FIG. 3 is a circuit diagram of a preferred embodiment of a fully integrated FM detector.
Figure 4:
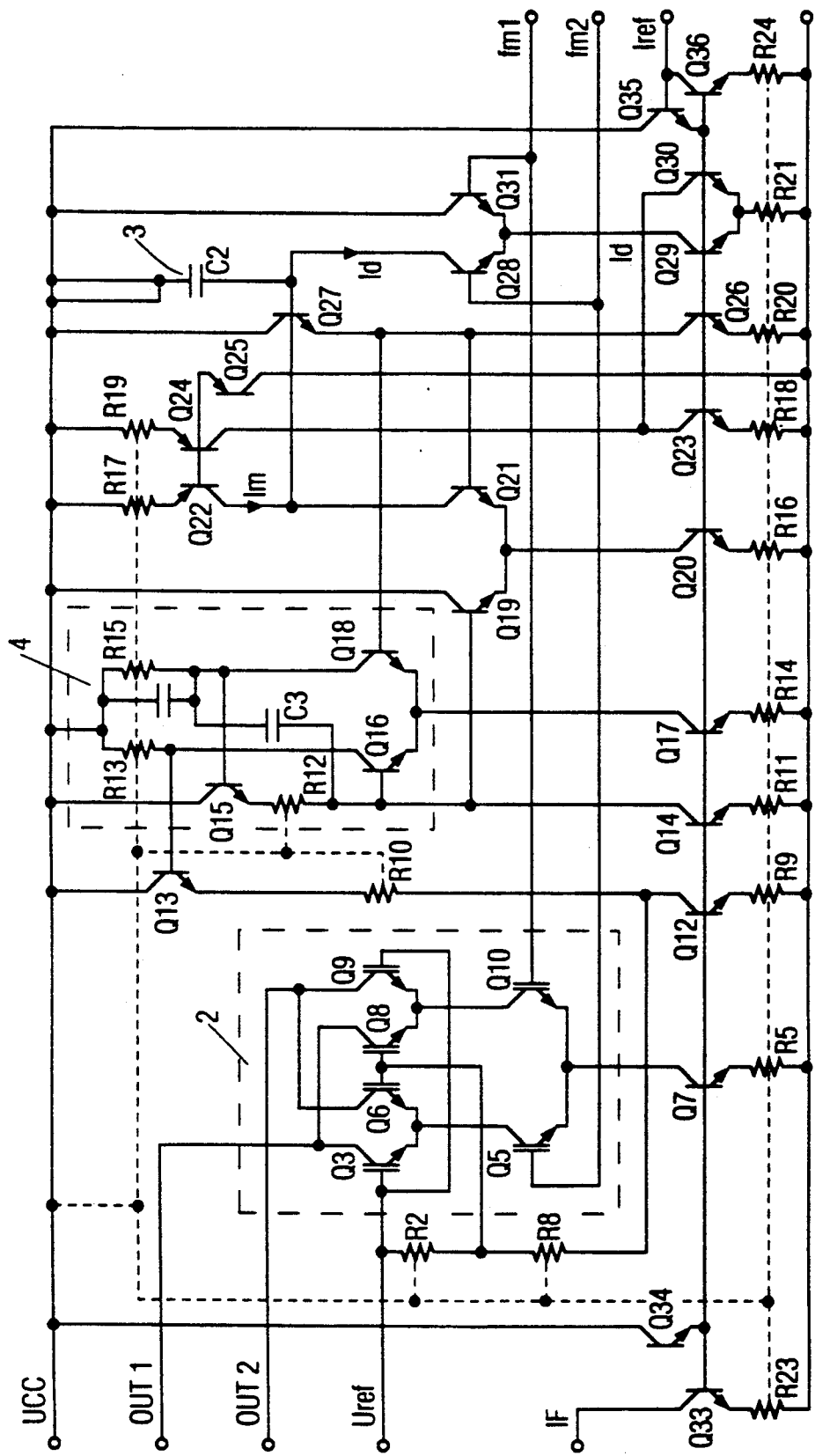
FIG. 4 is a detailed circuit diagram of an FM detector according to FIG. 3.

As illustrated in FIG. 1, the oscillator 1 is the heart of the FM detector. The control current I0 (in FIG. 3) is modulated by the input signal. When its frequency lies close to the freerunning frequency fz of the oscillator it is synchronized and exhibits the time characteristics shown in the timing diagram of FIG. 3. When the incoming input signal has the same frequency as the freerunning frequency fz of the oscillator, a phase shift of 90 degrees results. Deviations from the freerunning frequency result in a linear phase deviation (see FIG. 3). Simulation and measurement of a manufactured component exhibited good characteristics; signal-to-noise ratio 70 dB, distortion less than 2 percent, and 40 dB side carrier spacing.

Figure 5:
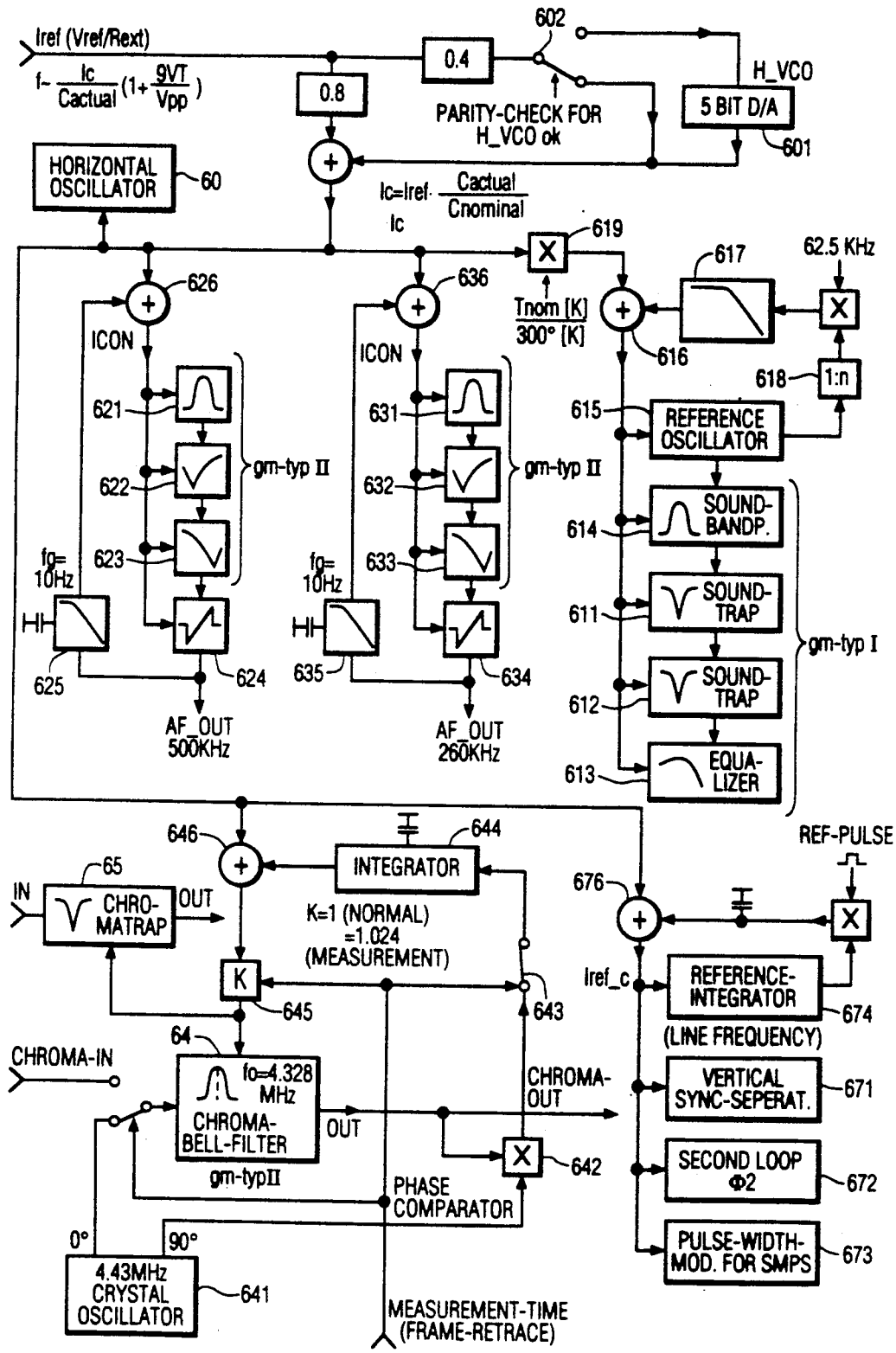
FIG. 5 is a 'balancing tree' with FM detectors according to the preceding FIGURES.

The manufacture of "one-chip" receivers requires the alignment of the analog circuits fabricated on the chip, for example filters and FM detectors, owing to component tolerances and fabrication variations. A compensation tree, as shown in FIG. 5, is provided for such alignment. A horizontal frequency oscillator 60 is the reference circuit section. The frequency of oscillator 60 can be easily measured and, with the help of the 5-bit digital-to-analog converter 601, be compensated with an error of less than ±1 percent. With the manufacture of television devices, the digital-to-analog converter 601 can be aligned using software, after which the alignment is stored.

The contents of the memory can be undesirably altered by high voltage surges to the digital-to-analog converter 601. The horizontal frequency could become too low and the horizontal output stage and a switch mode power supply could be destroyed. Therefore a parity check is performed in the digital-to-analog converter 601. When this check reveals an error, then a maximum control current is switched on by means of the switch 602. The horizontal frequency increase is limited and destruction of circuits is prevented.

When the horizontal frequency oscillator 60 is aligned, a control current Ic results from the reference current Iref, where: Iref=Vref/Rext. Because of manufacturing variations the capacitors can have an actual capacitance of $C_{actual}$ compared to a desired capacitance of $C_{nominal}$. The control current Ic is aligned (capacitor-adjusted) to the value Ic=Iref* $C_{actual}/C_{actual}$. Current $C_{actual}$ can be indirectly measured by measuring the frequency of the horizontal frequency oscillator 60.

The output frequency of the horizontal frequency oscillator depends primarily upon the control current Ic. However, the output frequency is also slightly dependent upon the temperature voltage Vt and the peak-peak output voltage Vpp. Accordingly, the output frequency is approximately Ic/$C_{actual}$*(1+9*Vt/Vpp). For this reason it is necessary to slightly hand align some of the analog circuit sections which are also aligned by the control current Ic. For this reason, five control loops are provided in the integrated circuit for different circuit sections. In these control loops the control current Ic is combined with a correction current (Icon) in the summation points 616, 626, 636, 646 and 676.

The analog filters 621 and 623 and an FM demodulator 624 process a first sound channel, the analog filters 631 through 633 and an FM demodulator 634 process a second sound channel. The criterion for the fine tuning of the two sound channels is the direct voltage offset at the output terminals of the Fm demodulators 624 and 634, respectively. The output voltages of the demodulators 624 and 634 are filtered in the low pass filters 625 and 635, respectively, with a limit frequency of 10 Hz. The resulting direct voltages generate the correction currents Icon 26 and Icon 36.

The fine tuning of the sound traps 611 and 612, of the equalizer 613 (in the picture IF) and of the preselection filter 614 (in the sound IF) is effected by using an additional reference Biquad filter 617, which is located in the feedback of a PLL loop. The PLL loop contains a reference oscillator 615 and a programmable 1:n divider 618. The PLL loop locates the limit frequency of the reference Biquad filter 617 in relation to the frequency of the sound traps 611 and 612, of the equalizer 613, and of the preselection filter 614 so that good synchronism results.

Because of the high frequencies to be processed, type 1 gm amplifiers are used for the sound traps 611 and 612, the equalizer 613, and the preselection filter 614. The control current Ic subsequently undergoes a temperature dependent correction in the correction circuit 619. Because of fine tuning of the chroma-bell-filter 64, only errors of a maximum of ±0.1% are accepted. In addition, the quality of the chroma- bell-filter 64 must reach the value of sixteen. For this reason a different method of fine tuning is applied. During the vertical line flyback time the chroma-bell-filter 64 is switched to an alignment mode. A quartz oscillator 641 tuned to the color subcarrier frequency is applied to the filter 64 and the phases of the signals at the input terminal and the output terminal of the filter are compared in a phase comparator 642. When the phase difference is zero the center frequency of the chroma-bell-filter 64 corresponds with the color subcarrier frequency. When PAL is used the color subcarrier frequency is 4.43 MHz. The output terminal of phase comparator 642 is connected to a scan and hold circuit 643. Because small leakage currents are necessary, the scan and hold circuit 643 is provided with operational amplifiers with NMOS inputs (not shown). The amplifiers are followed by an integrator 644, which generates the correction current for the control current Ic. In addition, during the measuring period a small correction factor of approximately 2.3% is introduced by the correction circuit 645 because the desired center frequency (4.328 MHz for PAL) of the chroma-bell-filter 64 deviates slightly from the color subcarrier frequency (4.43 MHz for PAL).

The alignment of the color subcarrier trap 65 is less critical. The same control current is used as for the chroma-bell-filter 64. The control current correction value for the vertical sync-separator 671, needed for a Phi2 loop circuit 672 and a pulse width modulator 673 for use with a switch mode power supply is gained through a further PLL loop including a reference integrator 674. The described alignment process with automatic fine tuning is suitable for integrated bipolar and BICMOS circuits. The invention is advantageous because temperature dependence of the circuit sections is eliminated by the use of the additional fine tuning.

We claim:

1. In an FM detector for demodulating frequency modulated signals, said FM detector including an oscillator having a capacitor and a hysteresis level detector, said oscillator being controlled by the input signal to said FM detector, said FM detector also including a phase detector for mixing said input signal with an oscillator signal from said oscillator and providing an output signal, an improvement for setting said oscillator to the frequency of said input signal using components internal to said FM detector comprising:

first switch means for charging and discharging said capacitor in accordance with the state of said hysteresis level detector; and second switch means for setting the frequency of said oscillator to the frequency of said input signal, and wherein said second switch means supplies a control current to said capacitor and wherein upon engagement of said frequency of said oscillator to said frequency of said input signal, the current controlled by said second switch means is equal to zero.

2. In an FM detector for demodulating frequency modulated signals, said FM detector including an oscillator having a capacitor and a hysteresis level detector, said oscillator being controlled by the input signal to said FM detector, said FM detector also including a phase detector for mixing said input signal with an oscillator signal from said oscillator and providing an output signal, an improvement for setting said oscillator to the frequency of said input signal using components internal to said FM detector comprising:

first switch means for charging and discharging said capacitor in accordance with the state of said hysteresis level detector; and second switch means for setting the frequency of said oscillator to the frequency of said input signal; and wherein said hysteresis level detector includes a filter capacitor for limiting the bandwidth thereof for signal-to-noise ratio enhancement.

* * * * *